(12) United States Patent
Lan (10) Patent No.: US 8,988,760 B2
(45) Date of Patent: *Mar. 24, 2015

(54) ENCAPSULATED ELECTROMECHANICAL DEVICES

(75) Inventor: Je-Hsiung Lan, Cupertino, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 903 days.

This patent is subject to a terminal disclaimer.

(21) Appl. No.: 12/844,184

(22) Filed: Jul. 27, 2010

(65) Prior Publication Data

US 2010/0290102 A1 Nov. 18, 2010

Related U.S. Application Data

(63) Continuation of application No. 12/175,355, filed on Jul. 17, 2008, now Pat. No. 7,782,522.

(51) Int. Cl.
G02B 26/00 (2006.01)
B81C 1/00 (2006.01)

(52) U.S. Cl.
CPC ......... B81C 1/0023 (2013.01); *B81B 2201/047* (2013.01); *B81B 2207/095* (2013.01); *B81C 2203/0136* (2013.01); *B81C 2203/0145* (2013.01)
USPC .......................................................... 359/290

(58) Field of Classification Search
USPC .................. 257/433, 444, 787, 788, E21.499, 257/E21.502, E21.503, 900; 359/290–292, 359/214, 223, 224
See application file for complete search history.

(56) References Cited

U.S. PATENT DOCUMENTS

| | | |
|---|---|---|
| 4,954,789 A | 9/1990 | Sampsell |
| 5,018,256 A | 5/1991 | Hornbeck |
| 5,099,353 A | 3/1992 | Hornbeck |
| 5,255,093 A | 10/1993 | Topper et al. |
| 5,396,593 A | 3/1995 | Mori et al. |
| 5,481,274 A | 1/1996 | Aratani et al. |
| 5,483,260 A | 1/1996 | Parks et al. |
| 5,485,304 A | 1/1996 | Kaeriyama |
| 5,650,834 A | 7/1997 | Nakagawa et al. |
| 5,784,189 A | 7/1998 | Bozler et al. |
| 5,835,255 A | 11/1998 | Miles |
| 5,986,796 A | 11/1999 | Miles |

(Continued)

FOREIGN PATENT DOCUMENTS

| | | |
|---|---|---|
| DE | 102 26 027 | 12/2003 |
| EP | 1 640 330 | 3/2006 |

(Continued)

OTHER PUBLICATIONS

IPRP for PCT/US09/049964, dated Jan. 27, 2011.

(Continued)

*Primary Examiner* — Tuyen Tra
(74) *Attorney, Agent, or Firm* — Knobbe Martens Olson & Bear LLP (57) ABSTRACT

Encapsulation is provided to electromechanical devices to protect the devices from such environmental hazards as moisture and mechanical shock. In addition to the encapsulation layer providing protection from environmental hazards, the encapsulation layer is additionally planarized so as to function as a substrate for additional circuit elements formed above the encapsulation layer.

30 Claims, 10 Drawing Sheets

(56) References Cited

U.S. PATENT DOCUMENTS

| | | |
|---|---|---|
| 6,040,937 A | 3/2000 | Miles |
| 6,055,090 A | 4/2000 | Miles |
| 6,144,479 A * | 11/2000 | Lugg et al. ............ 359/267 |
| 6,246,398 B1 | 6/2001 | Koo |
| 6,323,982 B1 | 11/2001 | Hornbeck |
| 6,404,942 B1 * | 6/2002 | Edwards et al. ............ 385/18 |
| 6,433,917 B1 | 8/2002 | Mei et al. |
| 6,446,486 B1 | 9/2002 | Deboer et al. |
| 6,466,486 B2 | 10/2002 | Kawasumi |
| 6,552,840 B2 | 4/2003 | Knipe |
| 6,574,033 B1 | 6/2003 | Chui et al. |
| 6,589,625 B1 | 7/2003 | Kothari et al. |
| 6,650,455 B2 | 11/2003 | Miles |
| 6,674,562 B1 | 1/2004 | Miles et al. |
| 6,680,792 B2 | 1/2004 | Miles |
| 6,682,199 B2 | 1/2004 | Kaneko |
| 6,710,908 B2 | 3/2004 | Miles et al. |
| 6,747,800 B1 | 6/2004 | Lin |
| 6,750,876 B1 | 6/2004 | Atsatt et al. |
| 6,781,643 B1 | 8/2004 | Watanabe et al. |
| 6,794,119 B2 | 9/2004 | Miles |
| 6,800,503 B2 | 10/2004 | Kocis et al. |
| 6,813,060 B1 | 11/2004 | Garcia et al. |
| 6,825,835 B2 | 11/2004 | Sano et al. |
| 6,867,896 B2 | 3/2005 | Miles |
| 6,903,860 B2 | 6/2005 | Ishii |
| 7,012,732 B2 | 3/2006 | Miles |
| 7,042,643 B2 | 5/2006 | Miles |
| 7,110,158 B2 | 9/2006 | Miles |
| 7,123,216 B1 | 10/2006 | Miles |
| 7,126,738 B2 | 10/2006 | Miles |
| 7,138,984 B1 | 11/2006 | Miles |
| 7,139,112 B2 | 11/2006 | Whitehead et al. |
| 7,142,346 B2 | 11/2006 | Chui et al. |
| 7,161,728 B2 | 1/2007 | Sampsell et al. |
| 7,187,489 B2 | 3/2007 | Miles |
| 7,196,837 B2 | 3/2007 | Sampsell et al. |
| 7,236,284 B2 | 6/2007 | Miles |
| 7,242,512 B2 | 7/2007 | Chui et al. |
| 7,250,315 B2 | 7/2007 | Miles |
| 7,256,922 B2 | 8/2007 | Chui et al. |
| 7,280,265 B2 | 10/2007 | Miles |
| 7,297,471 B1 | 11/2007 | Miles |
| 7,301,704 B2 | 11/2007 | Miles |
| 7,310,179 B2 | 12/2007 | Chui et al. |
| 7,321,457 B2 | 1/2008 | Heald |
| 7,327,510 B2 | 2/2008 | Cummings et al. |
| 7,345,805 B2 | 3/2008 | Chui |
| 7,355,782 B2 | 4/2008 | Miles |
| 7,369,296 B2 | 5/2008 | Floyd |
| 7,372,613 B2 | 5/2008 | Chui et al. |
| 7,372,619 B2 | 5/2008 | Miles |
| 7,379,227 B2 | 5/2008 | Miles |
| 7,382,515 B2 | 6/2008 | Chung et al. |
| 7,385,748 B2 | 6/2008 | Miles |
| 7,388,697 B2 | 6/2008 | Chui et al. |
| 7,388,706 B2 | 6/2008 | Miles |
| RE40,436 E | 7/2008 | Kothari et al. |
| 7,405,863 B2 | 7/2008 | Tung et al. |
| 7,417,784 B2 | 8/2008 | Sasagawa et al. |
| 7,460,291 B2 | 12/2008 | Sampsell et al. |
| 7,463,421 B2 | 12/2008 | Miles |
| 7,471,444 B2 | 12/2008 | Miles |
| 7,483,197 B2 | 1/2009 | Miles |
| 7,486,429 B2 | 2/2009 | Chui |
| 7,486,867 B2 | 2/2009 | Wang |
| 7,489,428 B2 | 2/2009 | Sampsell et al. |
| 7,511,875 B2 | 3/2009 | Miles |
| 7,527,996 B2 | 5/2009 | Luo et al. |
| 7,532,194 B2 | 5/2009 | Chui |
| 7,532,377 B2 | 5/2009 | Miles |
| 7,532,381 B2 | 5/2009 | Miles |
| 7,532,386 B2 | 5/2009 | Cummings et al. |
| 7,534,640 B2 | 5/2009 | Sasagawa et al. |
| 7,535,466 B2 | 5/2009 | Sampsell et al. |
| 7,535,621 B2 | 5/2009 | Chiang |
| 7,545,554 B2 | 6/2009 | Chui et al. |
| 7,547,565 B2 | 6/2009 | Lin |
| 7,550,794 B2 | 6/2009 | Miles et al. |
| 7,554,711 B2 | 6/2009 | Miles |
| 7,556,917 B2 | 7/2009 | Miles |
| 7,556,981 B2 | 7/2009 | Cummings |
| 7,561,321 B2 | 7/2009 | Heald |
| 7,564,613 B2 | 7/2009 | Sasagawa et al. |
| 7,566,940 B2 | 7/2009 | Sasagawa et al. |
| 7,567,373 B2 | 7/2009 | Chui et al. |
| 7,576,901 B2 | 8/2009 | Chui et al. |
| 7,586,484 B2 | 9/2009 | Sampsell et al. |
| 7,601,571 B2 | 10/2009 | Chui et al. |
| 7,605,969 B2 | 10/2009 | Miles |
| 7,619,810 B2 | 11/2009 | Miles |
| 7,623,287 B2 | 11/2009 | Sasagawa et al. |
| 7,630,119 B2 | 12/2009 | Tung et al. |
| 7,642,110 B2 | 1/2010 | Miles |
| 7,643,305 B2 | 1/2010 | Lin |
| 7,646,529 B2 | 1/2010 | Chui |
| 7,649,671 B2 | 1/2010 | Kothari et al. |
| 7,660,031 B2 | 2/2010 | Floyd |
| 7,660,058 B2 | 2/2010 | Qiu et al. |
| 7,672,035 B2 | 3/2010 | Sampsell et al. |
| 7,679,627 B2 | 3/2010 | Sampsell et al. |
| 7,679,812 B2 | 3/2010 | Sasagawa et al. |
| 7,692,844 B2 | 4/2010 | Miles |
| 7,704,773 B2 | 4/2010 | Kogut et al. |
| 7,711,239 B2 | 5/2010 | Sasagawa et al. |
| 7,719,754 B2 | 5/2010 | Patel et al. |
| 7,723,015 B2 | 5/2010 | Miles |
| 7,738,157 B2 | 6/2010 | Miles |
| 7,747,109 B2 | 6/2010 | Zhong et al. |
| 7,776,631 B2 | 8/2010 | Miles |
| 7,781,850 B2 | 8/2010 | Miles et al. |
| 7,782,522 B2 | 8/2010 | Lan |
| 7,782,525 B2 | 8/2010 | Sampsell et al. |
| 7,791,787 B2 | 9/2010 | Miles |
| 7,800,809 B2 | 9/2010 | Miles |
| 7,808,694 B2 | 10/2010 | Miles |
| 7,826,120 B2 | 11/2010 | Miles |
| 7,830,586 B2 | 11/2010 | Miles |
| 7,830,587 B2 | 11/2010 | Miles |
| 7,830,588 B2 | 11/2010 | Miles |
| 7,830,589 B2 | 11/2010 | Floyd |
| 7,835,093 B2 | 11/2010 | Wang |
| 7,839,556 B2 | 11/2010 | Miles |
| 7,839,557 B2 | 11/2010 | Chui et al. |
| 7,839,559 B2 | 11/2010 | Miles |
| 7,846,344 B2 | 12/2010 | Miles |
| 7,848,001 B2 | 12/2010 | Miles |
| 7,848,004 B2 | 12/2010 | Miles |
| 7,852,544 B2 | 12/2010 | Sampsell et al. |
| 7,852,545 B2 | 12/2010 | Miles |
| 7,864,402 B2 | 1/2011 | Chui et al. |
| 7,872,792 B2 | 1/2011 | Miles |
| 7,875,485 B2 | 1/2011 | Sasagawa et al. |
| 7,898,722 B2 | 3/2011 | Miles |
| 7,903,316 B2 | 3/2011 | Kothari et al. |
| 7,907,319 B2 | 3/2011 | Miles |
| 7,916,980 B2 | 3/2011 | Lasiter |
| 7,920,135 B2 | 4/2011 | Sampsell et al. |
| 7,924,494 B2 | 4/2011 | Tung et al. |
| 7,929,197 B2 | 4/2011 | Miles |
| 7,936,031 B2 | 5/2011 | Sampsell et al. |
| 7,944,599 B2 | 5/2011 | Chui et al. |
| 7,944,603 B2 | 5/2011 | Sasagawa et al. |
| 7,948,671 B2 | 5/2011 | Tung et al. |
| 8,009,347 B2 | 8/2011 | Chui et al. |
| 8,014,059 B2 | 9/2011 | Miles |
| 8,035,884 B2 | 10/2011 | Miles |
| 8,054,532 B2 | 11/2011 | Miles |
| 8,059,326 B2 | 11/2011 | Miles |
| 8,064,124 B2 | 11/2011 | Chung et al. |
| 8,081,369 B2 | 12/2011 | Miles |
| 8,098,416 B2 | 1/2012 | Kothari et al. |
| 8,105,496 B2 | 1/2012 | Miles |
| 8,115,988 B2 | 2/2012 | Chui et al. |

(56) References Cited

U.S. PATENT DOCUMENTS

| | | | |
|---|---|---|---|
| 8,120,125 B2 | 2/2012 | Sasagawa et al. | |
| 8,124,434 B2 | 2/2012 | Gally et al. | |
| 8,149,497 B2 | 4/2012 | Sasagawa et al. | |
| 8,213,075 B2 | 7/2012 | Chui et al. | |
| 8,218,229 B2 | 7/2012 | Sasagawa et al. | |
| 8,229,253 B2 | 7/2012 | Zhong et al. | |
| 8,264,763 B2 | 9/2012 | Miles | |
| 8,278,726 B2 | 10/2012 | Miles et al. | |
| 8,284,474 B2 | 10/2012 | Miles | |
| 8,289,613 B2 | 10/2012 | Chui et al. | |
| 8,298,847 B2 | 10/2012 | Kogut et al. | |
| 8,344,470 B2 | 1/2013 | Sampsell et al. | |
| 8,368,124 B2 | 2/2013 | Miles et al. | |
| 8,422,108 B2 | 4/2013 | Miles | |
| 2001/0003487 A1 | 6/2001 | Miles | |
| 2002/0000959 A1 | 1/2002 | Colgan et al. | |
| 2002/0075555 A1 | 6/2002 | Miles | |
| 2004/0046920 A1 | 3/2004 | Hayata et al. | |
| 2004/0232500 A1 | 11/2004 | Rudhard et al. | |
| 2005/0046922 A1 | 3/2005 | Lin et al. | |
| 2005/0083565 A1* | 4/2005 | Yamazaki et al. | 359/244 |
| 2006/0044928 A1 | 3/2006 | Chui et al. | |
| 2006/0066596 A1 | 3/2006 | Sampsell et al. | |
| 2006/0066598 A1 | 3/2006 | Floyd | |
| 2006/0077504 A1* | 4/2006 | Floyd | 359/237 |
| 2006/0176241 A1 | 8/2006 | Sampsell | |
| 2006/0220160 A1 | 10/2006 | Miles | |
| 2006/0279495 A1 | 12/2006 | Moe et al. | |
| 2007/0093045 A1 | 4/2007 | Yamaguchi et al. | |
| 2007/0249078 A1 | 10/2007 | Tung et al. | |
| 2008/0084601 A1 | 4/2008 | Miles | |
| 2008/0157413 A1 | 7/2008 | Lin | |
| 2008/0158648 A1 | 7/2008 | Cummings | |
| 2008/0180576 A1 | 7/2008 | Anderson | |
| 2008/0191978 A1 | 8/2008 | Miles | |
| 2008/0192029 A1 | 8/2008 | Anderson et al. | |
| 2009/0201034 A1* | 8/2009 | Govil | 324/686 |
| 2009/0219604 A1* | 9/2009 | Miles | 359/290 |
| 2009/0237040 A1 | 9/2009 | Wadhwa | |
| 2009/0267934 A1 | 10/2009 | Chui et al. | |
| 2009/0267953 A1 | 10/2009 | Sampsell et al. | |
| 2010/0110526 A1 | 5/2010 | Chui | |
| 2010/0134503 A1 | 6/2010 | Sampsell et al. | |
| 2010/0220248 A1 | 9/2010 | Miles | |
| 2011/0019380 A1 | 1/2011 | Miles | |
| 2011/0026096 A1 | 2/2011 | Miles | |
| 2011/0043891 A1 | 2/2011 | Miles | |
| 2011/0058243 A1 | 3/2011 | Wang | |
| 2011/0080632 A1 | 4/2011 | Miles | |
| 2011/0148828 A1 | 6/2011 | Sampsell et al. | |
| 2011/0157010 A1 | 6/2011 | Kothari et al. | |
| 2011/0170166 A1 | 7/2011 | Miles | |
| 2011/0170167 A1 | 7/2011 | Miles | |
| 2011/0177745 A1 | 7/2011 | Lasiter | |
| 2011/0188110 A1 | 8/2011 | Miles | |
| 2012/0062310 A1 | 3/2012 | Miles | |
| 2012/0085731 A1 | 4/2012 | Miles | |
| 2012/0088027 A1 | 4/2012 | Kothari et al. | |
| 2012/0099174 A1 | 4/2012 | Miles | |
| 2012/0105385 A1 | 5/2012 | Sasagawa et al. | |
| 2012/0127556 A1 | 5/2012 | Gally et al. | |
| 2012/0134008 A1 | 5/2012 | Bita et al. | |
| 2012/0139976 A1 | 6/2012 | Chui et al. | |
| 2012/0162232 A1 | 6/2012 | He et al. | |
| 2012/0182595 A1 | 7/2012 | Miles | |
| 2012/0188215 A1 | 7/2012 | Bushankuchu | |
| 2012/0194897 A1 | 8/2012 | Zhong et al. | |
| 2012/0287138 A1 | 11/2012 | Zhong et al. | |
| 2013/0069958 A1 | 3/2013 | Chui et al. | |
| 2013/0249964 A1 | 9/2013 | Sampsell et al. | |
| 2013/0335312 A1 | 12/2013 | Sasagawa | |

FOREIGN PATENT DOCUMENTS

| | | |
|---|---|---|
| JP | 2002-062490 | 2/2000 |
| JP | 2002175053 | 6/2002 |
| JP | 2004004553 | 1/2004 |
| WO | WO 2004/054088 | 6/2004 |
| WO | WO 2007/060289 | 5/2007 |
| WO | WO 2009/120558 | 10/2009 |

OTHER PUBLICATIONS

Miles, MEMS-based interferometric modulator for display applications, Part of the SPIE Conference on Micromachined Devices and Components, 3876:20-28 (1999).

Miles et al., 2000, 5.3: Digital Paper™: Reflective displays using interferometric modulation, SID Digest, vol. XXXI, pp. 32-35.

ISR and WO for PCT/US09/049964, dated May 11, 2010.

U.S. Appl. No. 08/554,630, filed Nov. 6, 1995 by Miles, Mark W.
U.S. Appl. No. 08/769,947, filed Dec. 19, 1996 by Miles, Mark W.
U.S. Appl. No. 10/909,228, filed Jul. 29, 2004 by Miles, Mark W.
U.S. Appl. No. 11/048,662, filed Jan. 27, 2005 by Cummings, William J.
U.S. Appl. No. 11/140,561, filed May 26, 2005 by Miles, Mark W.
U.S. Appl. No. 11/267,814, filed Nov. 4, 2005 by Miles, Mark W.
U.S. Appl. No. 11/267,929, filed Nov. 4, 2005 by Miles, Mark W.
U.S. Appl. No. 11/327,190, filed Jan. 6, 2006 by Miles, Mark W.
U.S. Appl. No. 11/347,013, filed Feb. 3, 2006 by Miles, Mark W.
U.S. Appl. No. 11/841,856, filed Aug. 20, 2007 by Miles, Mark W.
U.S. Appl. No. 11/841,876, filed Aug. 20, 2007 by Miles, Mark W.
U.S. Appl. No. 11/841,884, filed Aug. 20, 2007 by Miles, Mark W.
U.S. Appl. No. 11/841,894, filed Aug. 20, 2007 by Miles, Mark W.
U.S. Appl. No. 11/841,916, filed Aug. 20, 2007 by Miles, Mark W.
U.S. Appl. No. 11/841,924, filed Aug. 20, 2007 by Miles, Mark W.
U.S. Appl. No. 11/841,948, filed Aug. 20, 2007 by Miles, Mark W.
U.S. Appl. No. 11/841,961, filed Aug. 20, 2007 by Miles, Mark W.
U.S. Appl. No. 11/841,974, filed Aug. 20, 2007 by Miles, Mark W.
U.S. Appl. No. 11/841,988, filed Aug. 20, 2007 by Miles, Mark W.
U.S. Appl. No. 11/842,034, filed Aug. 20, 2007 by Miles, Mark W.
U.S. Appl. No. 12/967,375, filed Dec. 14, 2010 by Sampsell, Jeffrey Brian.
U.S. Appl. No. 13/401,138, filed Feb. 21, 2012 by Sasagawa Teruo.
U.S. Appl. No. 13/729,934, filed Dec. 28, 2012 by Sampsell Jeffrey B.

* cited by examiner

ENCAPSULATED ELECTROMECHANICAL DEVICES

CROSS-REFERENCE TO RELATED APPLICATIONS

This application is a continuation of, and claims priority under 35 U.S.C. §120 to, U.S. patent application Ser. No. 12/175,355 (now U.S. Pat. No. 7,782,522), filed Jul. 17, 2008, which is incorporated by reference in its entirety.

BACKGROUND

1. Field of the Invention

The field relates to microelectromechanical systems (MEMS), and more particularly to methods of encapsulation of MEMS devices.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

One aspect is an electromechanical device, comprising a substrate, an electromechanical element on the substrate, the electromechanical element comprising a movable component, a layer encapsulating the electromechanical element, wherein the layer is planarized, and an electronic element on or over the layer.

Other aspects of the invention include the electromechanical device wherein the electronic element comprises an active device, a passive device, display driver circuitry, sense circuitry, digital signal processing function. The digital signal processing functions comprise data filtering and control information decoding. Other aspects of the invention include the electromechanical device wherein the electronic element comprises variable resistors, variable capacitors, ESD protection, EM shielding, interconnect routing, RF functions (such as an antenna and power amp and data converters). The electronic element may also comprise a thin film transistor and may provide a means for electrically communicating with the electromechanical element.

Another aspect is a method of manufacturing a microelectromechanical system (MEMS) device, the method including forming a MEMS element on a substrate, the MEMS element including a gap, forming an encapsulation layer encapsulating the MEMS element, planarizing the encapsulation layer, and forming an electronic element on the encapsulation layer.

Another aspect is a microelectromechanical system (MEMS) device, including means for supporting a MEMS element, the MEMS element including a movable component, means for encapsulating the MEMS element, where the encapsulating means is planarized, and means for processing electronic signals on or over the encapsulating means.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Embodiments provide methods and devices which provide encapsulation to MEMS devices to protect the devices from such environmental hazards as moisture and mechanical shock. In addition to the encapsulation layer providing protection from environmental hazards, the encapsulation layer is additionally planarized so as to function as a substrate for additional circuit elements formed above the encapsulation layer.

Figure 1:
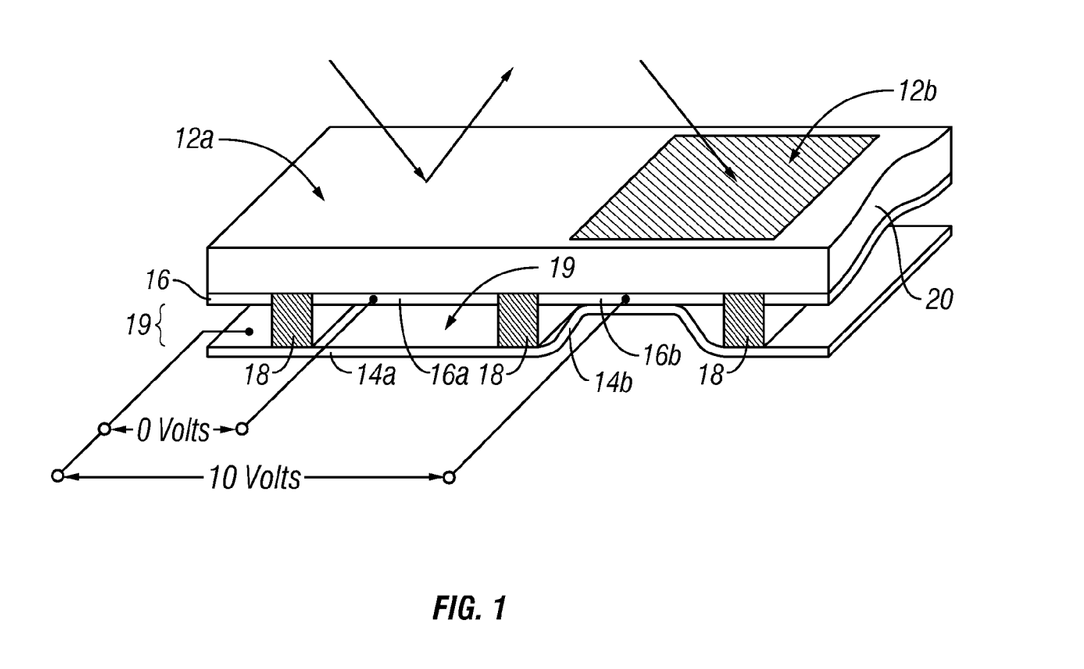
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
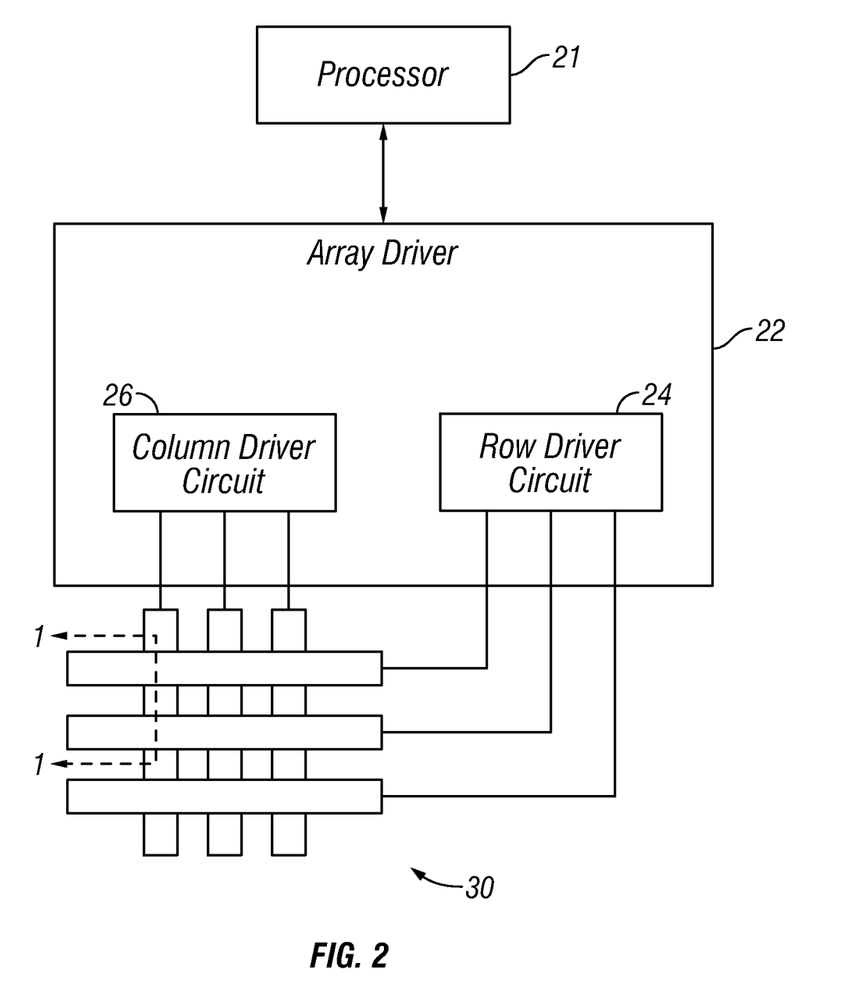
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2.

Figure 3A:
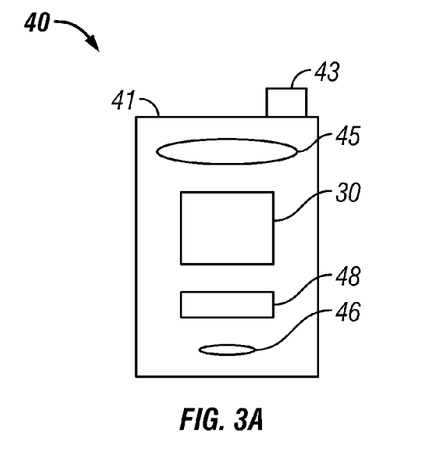
FIGS. 3A and 3B are system block diagrams illustrating an embodiment of a visual display device comprising a plurality of interferometric modulators.
Figure 3B:
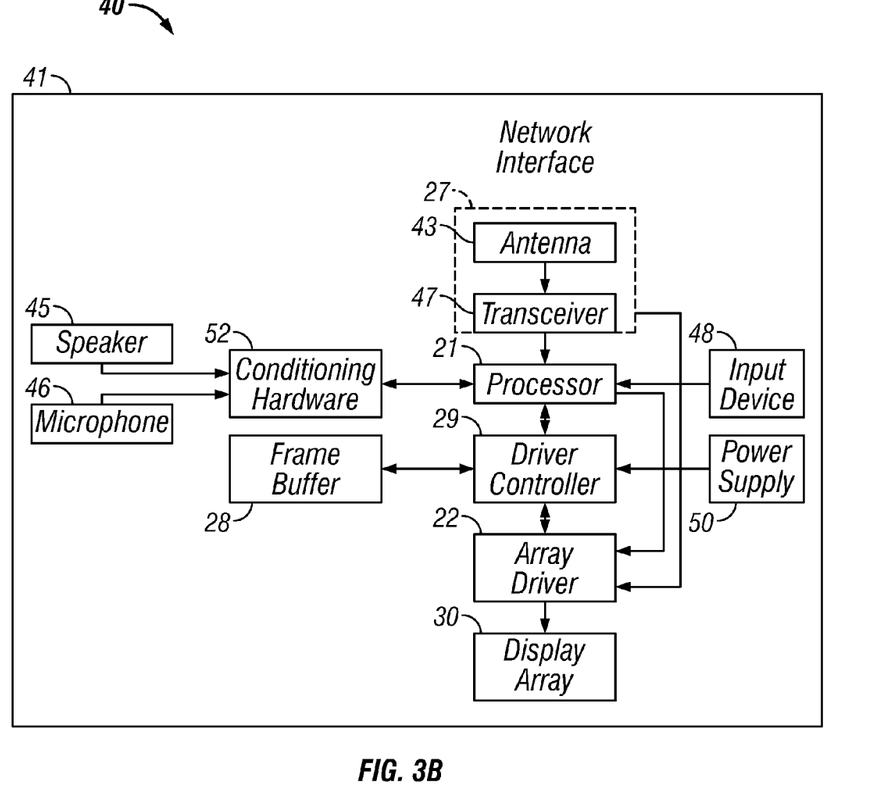

FIGS. 3A and 3B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 3B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 4A:
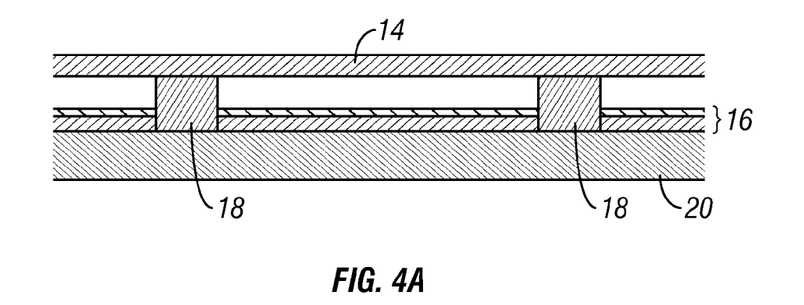
FIG. 4A is a cross section of the device of FIG. 1.
Figure 4B:
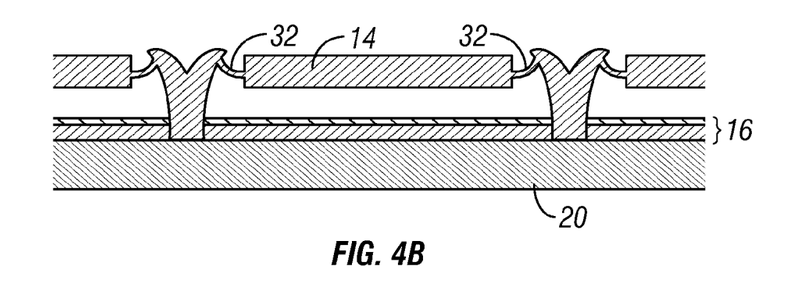
FIG. 4B is a cross section of an alternative embodiment of an interferometric modulator.
Figure 4C:
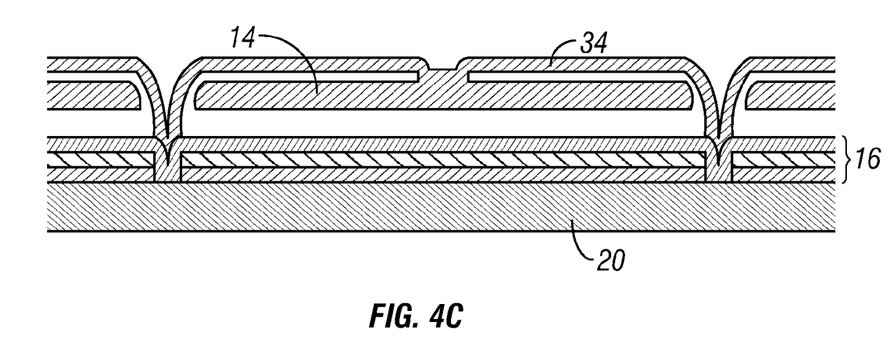
FIG. 4C is a cross section of another alternative embodiment of an interferometric modulator.
Figure 4D:
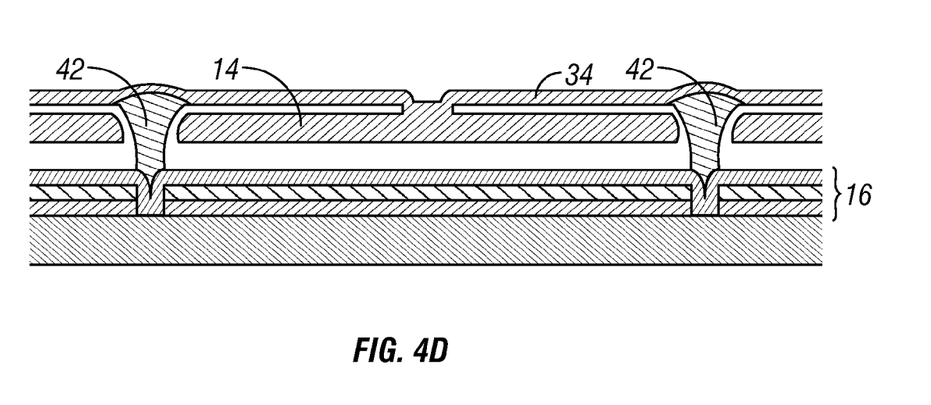
FIG. 4D is a cross section of yet another alternative embodiment of an interferometric modulator.
Figure 4E:
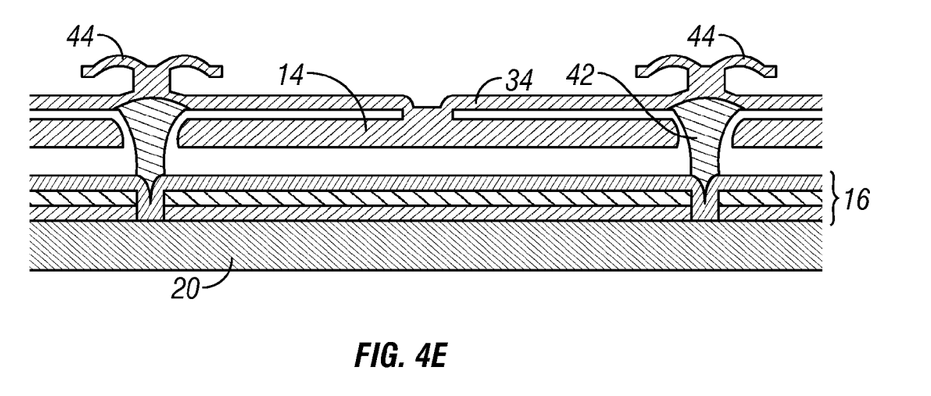
FIG. 4E is a cross section of an additional alternative embodiment of an interferometric modulator.

The details of the structure of interferometric modulators that operate in accordance with the principles set forth above may vary widely. For example, FIGS. 4A-4E illustrate five different embodiments of the movable reflective layer 14 and its supporting structures. FIG. 4A is a cross section of the embodiment of FIG. 1, where a strip of metal material 14 is deposited on orthogonally extending supports 18. In FIG. 4B, the moveable reflective layer 14 is attached to supports at the corners only, on tethers 32. In FIG. 4C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 4D has support post plugs 42 upon which the deformable layer 34 rests. The movable reflective layer 14 remains suspended over the gap, as in FIGS. 4A-4C, but the deformable layer 34 does not form the support posts by filling holes between the deformable layer 34 and the optical stack 16. Rather, the support posts are formed of a planarization material, which is used to form support post plugs 42. The embodiment illustrated in FIG. 4E is based on the embodiment shown in FIG. 4D, but may also be adapted to work with any of the embodiments illustrated in FIGS. 4A-4C, as well as additional embodiments not shown. In the embodiment shown in FIG. 4E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 4, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 4E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 4C-4E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

The following description is directed to methods and devices used for the encapsulation of MEMS devices, such as the interferometric modulators described above. The encapsulation layers described herein are applied to interferometric modulators, however, in other embodiments encapsulation layers can be applied to other MEMS devices.

Figure 5:
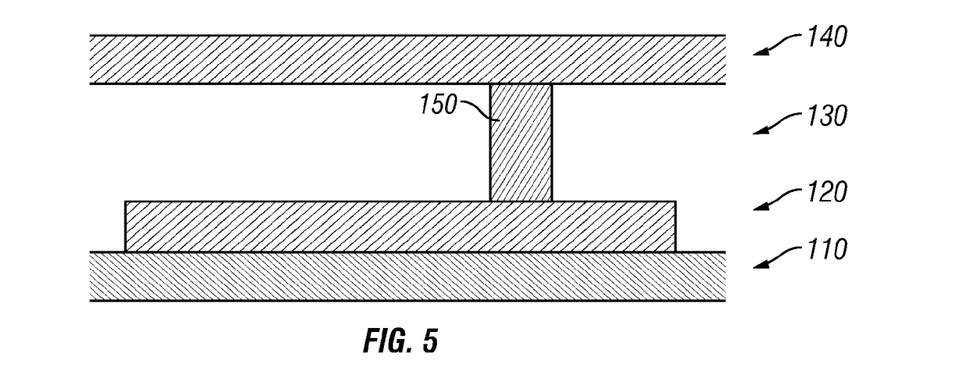
FIG. 5 is a cross section of a MEMS device comprising a encapsulation layer, which is planarized.

FIG. 5 is an illustration of an exemplary embodiment of a MEMS device 100 comprising substrate 110 with MEMS element 120 thereon. Over the MEMS element 120 is encapsulation layer 130 with an electronic element 140 thereon.

Substrate 110 supports the other components, and may, in some embodiments, be transparent or partially transparent. The substrate may be formed of, for example, glass, plastic, another material, or a combination thereof. The substrate provides a means for supporting MEMS element 120.

MEMS element 120 may be any MEMS device. For example, the MEMS element may be an interferometric modulator, a switch, or another MEMS element, or combination thereof. In some embodiments, the MEMS element comprises a gap and/or a moveable component. In some embodiments, the MEMS element may be any of the interferometric modulators described above and shown in FIGS. 4A-4E.

The MEMS element 120 is encapsulated by encapsulation layer 130. Encapsulation layer 130 may provide a hermetic seal for the interferometric modulator in order to protect it from environmental agents such as moisture and oxygen. The seal also allows for pressure within the MEMS element to be maintained independent from external pressure of the ambient environment. Thus, the MEMS element may be fabricated to maintain an environment that differs from the ambient environment. For example, during manufacturing, the encapsulation layer 130 can be manufactured with a via 150 that provides an electrical connection from the electronic element 140 to the MEMS element 120. In some embodiments the encapsulation layer seals all interferometric modulators in an array from the ambient environment, while in other embodiments only a portion of the interferometric modulators are sealed by the encapsulation layer. For example, an array may comprise some interferometric modulators which do not move. Such interferometric modulators may have a reflective layer manufactured at a known fixed position, and may not need to have encapsulation layer.

The encapsulation layer 130 may be formed of BCB, acrylic, polyimide, silicon oxide, silicon nitride, AlOx, oxynitride, etc.

When the moveable components of the MEMS element 120 move between various states, optional orifices within the MEMS element 120 (not shown in the cross-section of FIG. 5) allow for gasses to flow between around or through the MEMS element 120. The viscosity of the gasses within the device may slow the movement. Sealing the interferometric modulator array at the time of manufacturing with the encapsulation layer 130 allows for deliberate customization of the environment of the MEMS element 120. Because of the permanent nature of the encapsulation provided by encapsulation layer 130, the environment within each MEMS element 120 can persist throughout the lifetime of the array. For example, inducing a vacuum before sealing will substantially remove the gasses from the MEMS element 120, so that during use, the movement of the moveable components is not impeded by the cavity atmosphere. It should be realized that interferometric modulator arrays are typically sealed from the ambient environment by sealing a backplate to protect the array from the outside environment. While this type of sealant may still be used, it may also be unnecessary because the encapsulation layer 130 can also serve to protect the interior cavities from being affected by the ambient environment. Similarly, embodiments of the invention may also include the use of a desiccant to reduce the moisture levels within the MEMS element 120. However, the use of such desiccant may be unnecessary in view of the fact that the MEMS element 120 may be hermetically sealed by the encapsulation layer 130. The encapsulation layer 130 provides a means for sealing the MEMS element 120. The encapsulation layer 130 also provides a means for supporting the electronic element 140.

As shown in FIG. 5, in some embodiments, the encapsulation layer 130 comprises a via 150 which makes an electrical connection between the MEMS element 120 and the electronic element 140. The electronic element 140 may comprise passive and/or active elements, such as routing wires, resistors, capacitors, inductors, diodes, and transistors. These elements may also include variable elements, such as variable resistors and variable capacitors. The type of electronic element is not limited and other types of electronic elements may also be used. The electronic element may comprise display driver circuitry for at least one of rows, columns, portions of rows and/or columns, and individual deformable layers. The electronic element may additionally or alternatively comprise sense circuitry, used to determine the state of individual deformable layers or groups (such as rows or columns) of deformable layers. ESD protection, EM shielding, and interconnect routing may also be included in the electronic element. In some embodiments the electronic element may also comprise digital signal processing (DSP) functions such as data filtering and control information decoding. In some embodiments, the electronic element may comprise RF functions such as an antenna and a power amp, as well as data converters. The type and function of the electronic element is not limited and other types and functions may be implemented. In some embodiments, the electronic element provides a means for electrically communicating with the MEMS element.

In order to prepare the encapsulation layer 130 for the electronic element 140, the upper surface of the encapsulation layer 130 may be planarized. A planarization process may be performed to modify the upper surface of the encapsulation layer 130 so that it is substantially planar. Planarization allows the electronic element 140 to be formed without the effects of topological irregularities which would exist in the encapsulation layer 130 without the planarization. For some electronic elements, such as TFT's, topological irregularities can significantly affect performance parameters. Accordingly, when an array of electronic elements 140 is to be formed on an encapsulation layer 130 above an array of MEMS elements 110, planarization of the encapsulation layer 130 results in more consistent performance of the TFT's across the array.

FIGS. 6A-6E are cross sections of a MEMS device showing processing steps used to manufacture the MEMS device of FIG. 5. These figures show processing steps for the interferometric modulator shown in FIG. 4D. The processing steps may be analogously applied to other interferometric modulator embodiments, for example, any of the interferometric modulators shown in FIGS. 4A-4C, and 4E. Other processing steps can be used in addition to or alternatively.

Figure 6A:
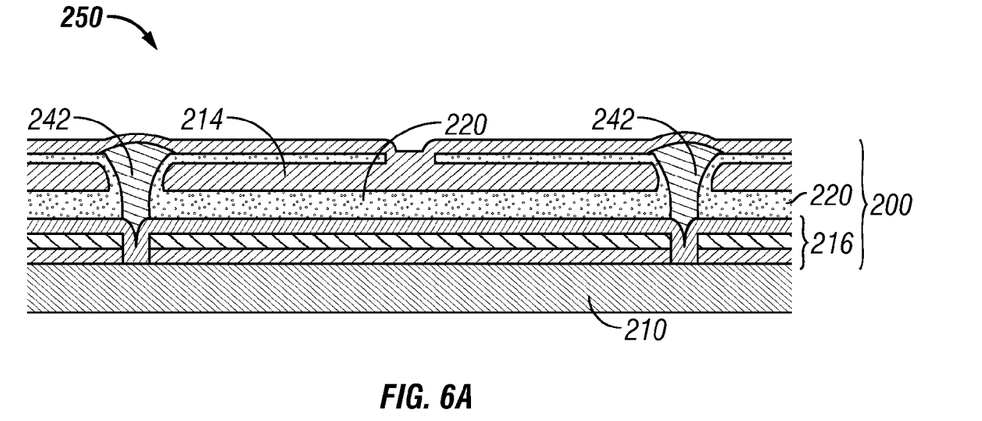
FIGS. 6A-6H are cross sections of a MEMS device showing processing steps used to manufacture the MEMS device of FIG. 5.

FIG. 6A is a cross section of MEMS device 250 at a particular point in the manufacturing process. MEMS device 250 at the point show has a MEMS element 200 built on substrate 210. MEMS element 200 includes moveable layer 214 supported on posts 242 and spaced apart from optical stack 216 by a gap. Moveable layer 214 may be similar to layer 14 described above, posts 242 may be similar to support post plugs 42 described above, and optical stack 216 may be similar to optical stack 16 described above. Also shown in FIG. 6A is sacrificial layer 220. The sacrificial layer 220 is used to form the MEMS element 200, and is removed later in the manufacturing process.

Figure 6B:
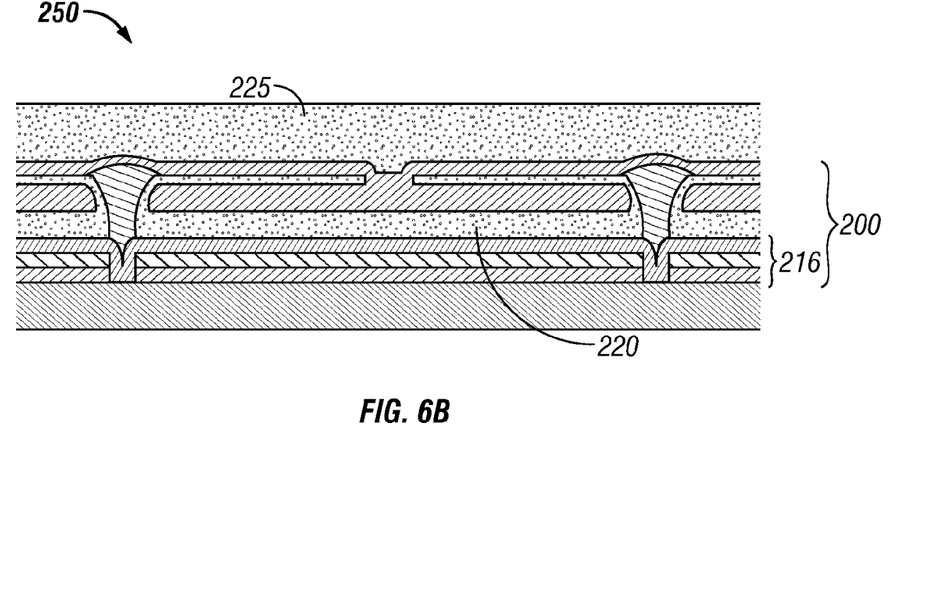
Figure 6C:
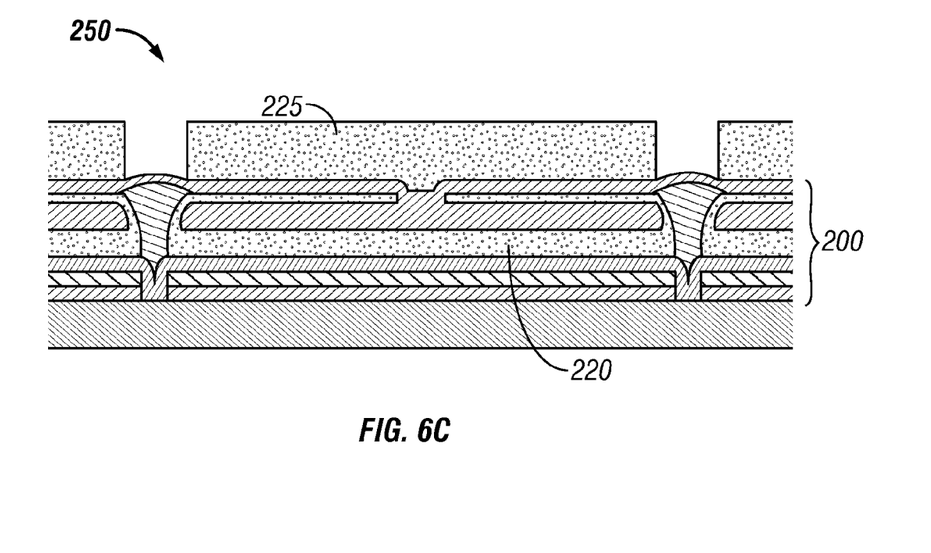

FIG. 6B is a cross section of MEMS device 250 at a second point in the manufacturing process. A second sacrificial layer 225 has been formed on the MEMS element 200. In FIG. 6C the second sacrificial layer 225 has been etched in preparation for forming an encapsulation layer.

Figure 6D:
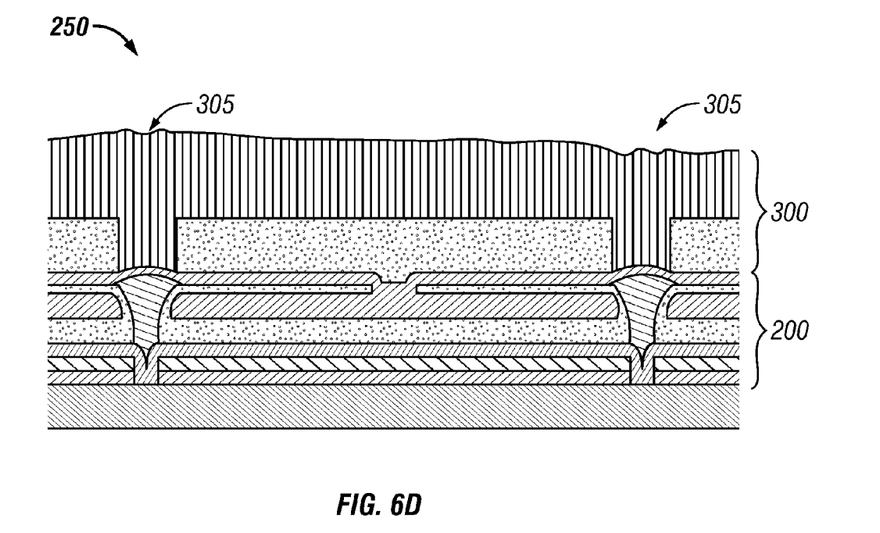

FIG. 6D is a cross section of MEMS device 250 showing MEMS element 200 covered by encapsulation layer 300. The encapsulation layer 300 can be formed of BCB, acrylic, polyimide, silicon oxide, silicon nitride, AlOx, oxynitride, etc. After formation the encapsulation layer 300 is typically non-planar, as indicated by irregular sections 305.

Figure 6E:
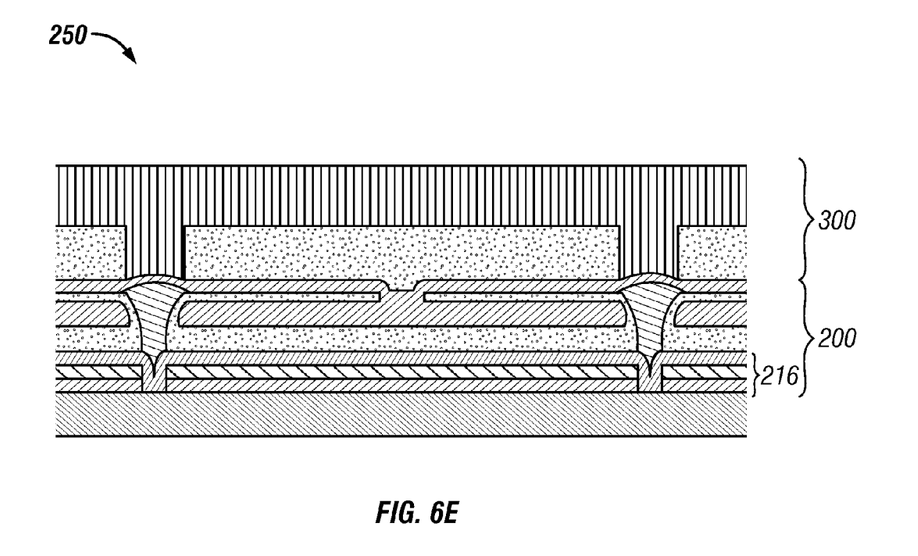

Because the encapsulation layer 300 forms a substrate for electronic elements placed thereon, the topological irregularities can affect the performance of some electronic elements. It is advantageous to perform a planarization process on the encapsulation layer 300 to substantially remove the topological irregularities. FIG. 6E shows the encapsulation layer 300 after planarization. The planarization process may include a mechanical polishing (MP) process, a chemical mechanical planarization (CMP) process, or a spin-coating process.

In these embodiments, the encapsulation layer 300 is spaced apart from the relaxed state position of the moveable layer 214 by the second sacrificial layer 225. The introduction of such a sacrificial layer may improve reliability of the device. During operation, the moveable layer 214 may forcefully move from an actuated position close to the optical stack 216 to the relaxed position away from the optical stack 216. Maintaining a space above the moveable layer 214 allows for the moveable layer 214 to "overshoot" the final relaxed state because of the mechanical restorative force. Without sufficient space, the deformable layer would collide with the encapsulating layer 300, potentially damaging the structure and shortening the life of the encapsulating layer 300 and/or the mechanical interferometric modulator structure.

Figure 6F:
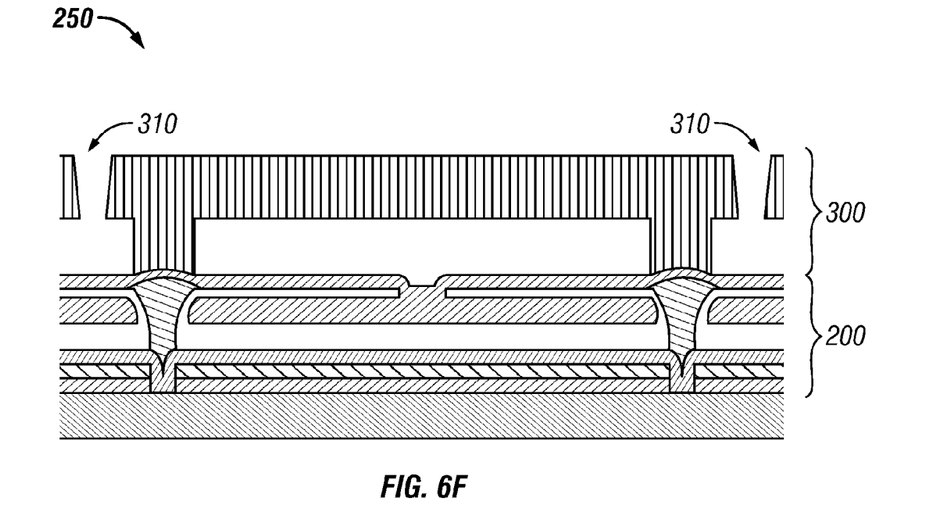

FIG. 6F shows MEMS device 250 where the encapsulation layer 300 has holes 310, and the sacrificial layers 220 and 225 have been removed. In some embodiments, the sacrificial layers 200 and 225 are removed through the holes 310 in the encapsulation layer 300. In some embodiments, the holes are used to create a desired environment for the MEMS element 200. For example, as discussed above, a substantial vacuum, or low pressure environment can be established with the holes 310.

Figure 6G:
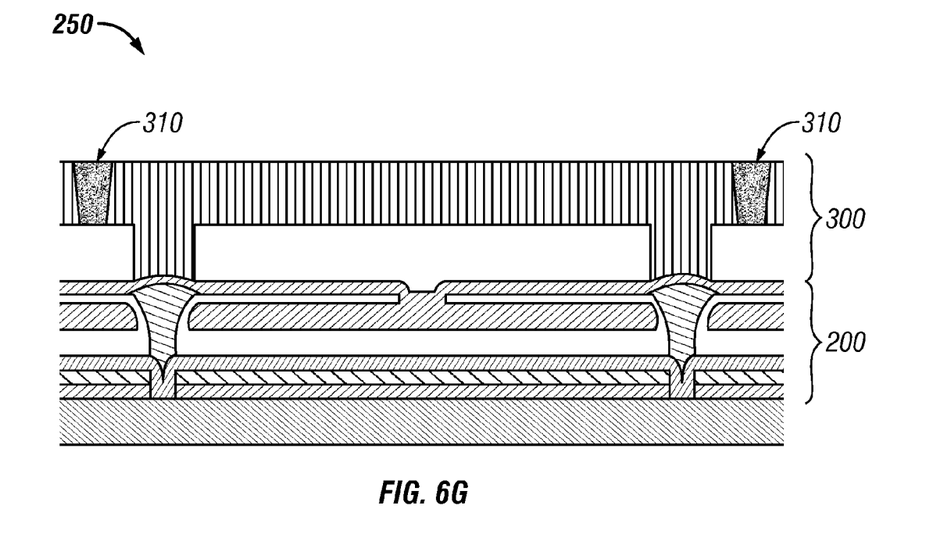

FIG. 6G shows MEMS device 250 where the holes 310 in the encapsulation layer 300 have been plugged. In some embodiments, the plugs are formed of a dielectric material. In some embodiments, the plugs are conductive. In some embodiments, the encapsulation layer 300 with plugged holes 310 forms a hermetic seal for the MEMS element 200.

Figure 6H:
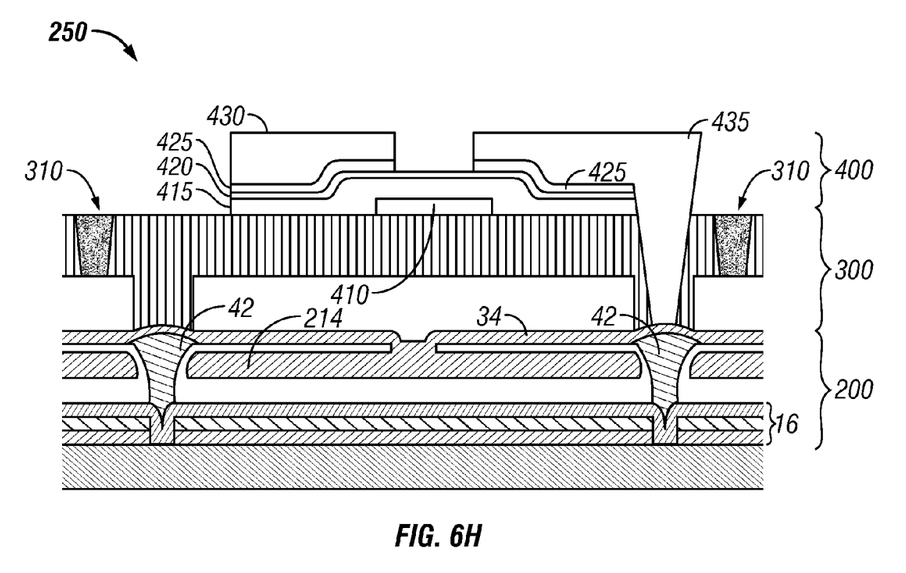

FIG. 6H shows MEMS device 250 with electronic element 400 formed on the encapsulation layer 300, which has been planarized. In this embodiment, electronic element 400 is a thin film transistor (TFT) having gate 410, insulator layer 415, semiconductor layer 420, source/drain layer 425, drain electrode 430, and source electrode 435. In this embodiment source electrode 435 is connected to moveable layer 214 through encapsulation layer 300. The electronic element 400 may comprise an interconnect layer and may comprise a connector configured to connect the MEMS device to another device. The electronic element 400 may comprise either or both of an active element and a passive element.

In various embodiments of the manufacturing process, the steps described above happen in a different order. For example, the encapsulation layer 300 may be planarized after the material of the sacrificial layer(s) is removed. The holes 310 may be plugged before the encapsulation layer 300 is planarized. The electronic element 400 may be formed after the encapsulation layer 300 is planarized, and before the material of the sacrificial layer(s) is removed. Accordingly, the atmosphere of the MEMS element 200 may be modified and the holes 310 plugged after the formation of the electronic element 300. In some embodiments, the holes may be plugged with conductive material which connects the electronic element 400 with the MEMS element 200.

While the above detailed description has shown, described, and pointed out novel features as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. An electromechanical device, comprising:
    a substrate;
    an electromechanical element on the substrate, the electromechanical element comprising a movable reflective layer;
    a layer encapsulating the electromechanical element, wherein the layer is planarized; and
    an electronic element on or over the layer on a side of the layer distal to the electromechanical element.

2. The electromechanical device of claim 1, wherein the electronic element comprises an active device.

3. The electromechanical device of claim 1, wherein the electronic element comprises a passive device.

4. The electromechanical device of claim 1, wherein the electronic element comprises display driver circuitry.

5. The electromechanical device of claim 1, wherein the electronic element comprises sense circuitry.

6. The electromechanical device of claim 1, wherein the electronic element comprises digital signal processing circuitry.

7. The electromechanical device of claim 6, wherein the digital signal processing circuitry includes a signal filter.

8. The electromechanical device of claim 6, wherein the digital signal processing circuitry includes a control information decoder.

9. The electromechanical device of claim 1, wherein the electronic element comprises a variable element.

10. The electromechanical device of claim 9, wherein the variable element is a variable resistor.

11. The electromechanical device of claim 9, wherein the variable element is a variable capacitor.

12. The electromechanical device of claim 1, wherein the electronic element further comprises electrostatic discharge protection.

13. The electromechanical device of claim 1, wherein the electronic element further comprises electromagnetic shielding.

14. The electromechanical device of claim 1, wherein the electronic element further comprises interconnect routing.

15. The electromechanical device of claim 1, wherein the electronic element comprises RF circuitry.

16. The electromechanical device of claim 15, wherein the RF circuitry includes an antenna and a power amp.

17. The electromechanical device of claim 15, wherein the RF circuitry includes data converters.

18. The electromechanical device of claim 1, wherein the electronic element comprises a thin film transistor.

19. The electromechanical device of claim 1, wherein the electronic element is capable of electrically communicating with the electromechanical element.

20. An electromechanical device, comprising:
    means for supporting an electromechanical element, the electromechanical element comprising a movable means for reflecting light;
    means for encapsulating the electromechanical element, wherein the encapsulating means is planarized; and
    means for processing electronic signals on or over the encapsulating means on a side of the encapsulating means distal to the electromechanical element.

21. The electromechanical device of claim 20, wherein the electromechanical element is an interferometric modulator.

22. The electromechanical device of claim 20, wherein the processing means is a thin film transistor.

23. The electromechanical device of claim 20, wherein the encapsulating means defines a hole therethrough.

24. The electromechanical device of claim 23, wherein the hole is plugged.

25. A method of manufacturing an encapsulated electromechanical device, comprising:
    forming an electromechanical element on a substrate, the electromechanical element comprising a movable reflective layer;
    forming an encapsulation layer encapsulating the electromechanical element;
    planarizing said encapsulation layer; and
    forming an electronic element on or over the encapsulation layer on a side of the encapsulation later distal to the electromechanical element.

26. The method of claim 25, wherein forming the encapsulation layer comprises;
    depositing a sacrificial layer on the electromechanical element;
    depositing the encapsulation layer on the sacrificial layer; and
    removing the sacrificial layer from the electromechanical device.

27. The method of claim 26, wherein removing the sacrificial layer from the electromechanical device comprises forming at least one hole in the encapsulation layer and removing the sacrificial layer through the hole.

28. The method of claim 27, further comprising plugging the hole in the encapsulation layer.

29. The method of claim 28, wherein the encapsulation layer is planarized after the hole is plugged.

30. The method of claim 25, further comprising electrically connecting the electromechanical element with the electronic element through the encapsulation layer.

* * * * *